(12) United States Patent
Nilsen et al.

(10) Patent No.: US 7,096,568 B1
(45) Date of Patent: Aug. 29, 2006

(54) METHOD OF MANUFACTURING A MICROCOMPONENT ASSEMBLY

(75) Inventors: Erik Nilsen, McKinney, TX (US); Matthew D. Ellis, Allen, TX (US); Charles L. Goldsmith, Plano, TX (US); Jeong Bong Lee, Plano, TX (US); Xiaojun Huang, Goleta, CA (US); Arun Kumar Nallani, Richardson, TX (US); Kabseog Kim, Dallas, TX (US); George D. Skidmore, Richardson, TX (US)

(73) Assignee: Zyvex Corporation, Richardson, TX (US)

( * ) Notice: Subject to any disclaimer, the term of this patent is extended or adjusted under 35 U.S.C. 154(b) by 434 days.

(21) Appl. No.: 10/616,735

(22) Filed: Jul. 10, 2003

(51) Int. Cl.
*H05B 3/00* (2006.01)

(52) U.S. Cl. ............................ 29/611; 29/840; 29/846; 257/678; 361/803; 439/65; 439/329; 977/724

(58) Field of Classification Search ................. 29/611, 29/840, 846; 257/678; 361/803; 439/65, 439/329; 977/724
See application file for complete search history.

(56) References Cited

U.S. PATENT DOCUMENTS

| | | |
|---|---|---|
| 3,268,774 A | 8/1966 | Ortner |
| 3,439,416 A | 4/1969 | Yando |
| 3,467,942 A | 9/1969 | Dell et al. |
| 3,588,618 A | 6/1971 | Otte |
| 4,018,409 A | 4/1977 | Burch et al. |
| 4,141,138 A | 2/1979 | Quick |
| 4,383,195 A | 5/1983 | Kolm et al. |
| 4,740,410 A | 4/1988 | Muller |
| 4,852,242 A | 8/1989 | Tella et al. |
| 4,911,098 A | 3/1990 | Tabata |
| 4,955,814 A | 9/1990 | Christie et al. |
| 4,963,748 A | 10/1990 | Szilagyi |
| 4,969,827 A | 11/1990 | Hahs, Jr. |
| 5,025,346 A | 6/1991 | Tang et al. |
| 5,072,288 A | 12/1991 | MacDonald et al. |
| 5,092,781 A | 3/1992 | Casciotti et al. |
| 5,113,117 A | 5/1992 | Brooks et al. |
| 5,122,663 A | 6/1992 | Chang et al. |
| 5,160,877 A | 11/1992 | Fujiwara et al. |
| 5,215,923 A | 6/1993 | Kinoshita et al. |
| 5,273,441 A | 12/1993 | Volz et al. |
| 5,399,415 A | 3/1995 | Chen et al. |
| 5,411,400 A | 5/1995 | Subrahmanyan et al. |
| 5,538,305 A | 7/1996 | Conway et al. |

(Continued)

FOREIGN PATENT DOCUMENTS

DE          19746585          4/1999

(Continued)

OTHER PUBLICATIONS

Harsh et al., "Solder Self-Assembly for MEMS," Proceedings of the 1998 International Instrumentation Symposium (ISA '98), Reno, NV, pp. 256-261, May 3-7, 1998.

(Continued)

*Primary Examiner*—A. Dexter Tugbang
*Assistant Examiner*—Tim Phan
(74) *Attorney, Agent, or Firm*—Haynes and Boone, LLP

(57) ABSTRACT

A new process and structure for microcomponent interconnection utilizing a post-assembly activated junction compound. In one embodiment, first and second microcomponents having respective first and second contact areas are provided. A junction compound is formed on one of the first and second contact areas, and the first and second contact areas are positioned adjacent each other on opposing sides of the junction compound. The junction compound is then activated to couple the first and second microcomponents.

27 Claims, 4 Drawing Sheets

U.S. PATENT DOCUMENTS

| | | | |
|---|---|---|---|
| 5,539,200 | A | 7/1996 | Lebby et al. |
| 5,610,335 | A | 3/1997 | Shaw et al. |
| 5,645,684 | A | 7/1997 | Keller |
| 5,657,516 | A | 8/1997 | Berg et al. |
| 5,660,680 | A | 8/1997 | Keller |
| 5,724,728 | A * | 3/1998 | Bond et al. ............... 29/840 |
| 5,746,621 | A | 5/1998 | Cronin |
| 5,774,956 | A | 7/1998 | French et al. |
| 5,806,152 | A | 9/1998 | Saitou |
| 5,818,748 | A | 10/1998 | Bertin |
| 5,848,456 | A | 12/1998 | Sjoqvist |
| 5,867,302 | A | 2/1999 | Flemming |
| 5,895,084 | A | 4/1999 | Mauro |
| 5,963,788 | A | 10/1999 | Barron et al. |
| 6,103,399 | A | 8/2000 | Smela et al. |
| 6,131,277 | A | 10/2000 | Cadenhead et al. |
| 6,154,936 | A | 12/2000 | Howell et al. |
| 6,193,139 | B1 | 2/2001 | Kivilahti |
| 6,193,541 | B1 | 2/2001 | Lee |
| 6,215,081 | B1 | 4/2001 | Jensen et al. |
| 6,218,664 | B1 | 4/2001 | Krans et al. |
| 6,219,254 | B1 | 4/2001 | Ackerling et al. |
| 6,239,685 | B1 | 5/2001 | Albrecht et al. |
| 6,257,925 | B1 | 7/2001 | Jones |
| 6,263,549 | B1 | 7/2001 | Uehara |
| 6,300,156 | B1 | 10/2001 | Decker et al. |
| 6,303,885 | B1 | 10/2001 | Hichwa et al. |
| 6,321,654 | B1 | 11/2001 | Robinson |
| 6,396,711 | B1 | 5/2002 | Degani et al. |
| 6,398,280 | B1 | 6/2002 | Parker et al. |
| 6,429,113 | B1 | 8/2002 | Lewis et al. |
| 6,483,419 | B1 | 11/2002 | Weaver et al. |
| 6,488,315 | B1 | 12/2002 | Brenner et al. |
| 6,531,947 | B1 | 3/2003 | Weaver et al. |
| 6,561,725 | B1 | 5/2003 | Ellis et al. |
| 6,617,522 | B1 | 9/2003 | Tabacutu |
| 6,672,795 | B1 | 1/2004 | Ellis et al. |
| 6,676,416 | B1 * | 1/2004 | Ellis et al. ................ 439/65 |
| 6,678,458 | B1 | 1/2004 | Ellis |
| 6,679,055 | B1 | 1/2004 | Ellis |
| 6,691,513 | B1 | 2/2004 | Kolesar |
| 6,745,567 | B1 | 6/2004 | Mercanzini |
| 6,762,116 | B1 | 7/2004 | Skidmore |
| 6,764,325 | B1 | 7/2004 | Arrigotti et al. |
| 6,837,723 | B1 | 1/2005 | Randall et al. |
| 6,862,921 | B1 | 3/2005 | Chand et al. |
| 6,881,074 | B1 | 4/2005 | McLenaghan |
| 6,923,669 | B1 | 8/2005 | Tsui et al. |
| 2001/0010348 | A1 | 8/2001 | Bilanin et al. |
| 2002/0125208 | A1 | 9/2002 | Christenson et al. |
| 2003/0201654 | A1 | 10/2003 | Ellis |
| 2003/0210115 | A1 | 11/2003 | Kubby et al. |
| 2004/0135526 | A1 | 7/2004 | Winkler et al. |

FOREIGN PATENT DOCUMENTS

| | | |
|---|---|---|
| EP | 0490530 | 6/1992 |
| EP | 0497620 | 8/1992 |
| JP | 57161819 | 10/1982 |
| JP | 05166973 | 7/1993 |
| JP | 06061691 | 3/1994 |
| WO | WO 9713981 | 4/1997 |

OTHER PUBLICATIONS

Harsh et al., "Flip-Chip Assembly for Si-Based RF MEMS," Proceedings of the 1999 IEEE International Conference on Microelectromechanical Systems (MEMS '99), Orlando, FL, pp. 273-278, Jan. 17-21, 1999.

Gracias et al., "Forming Electrical Networks in Three Dimensions by Self-Assembly," Science, vol. 289, pp. 1170-1172, Aug. 18, 2000.

Arai et al., "A New Pick Up & Release Method By Micromanipulation," IEEE, Jan. 1997.

Capanu et al., "Design, Fabrication, and Testing of a Bistable Electromagnetically Actuated Microvalve", Journal of Microelectromechnical Systems, vol. 9, No. 2, Jun. 2000, pp. 181-188.

Cohn et al., "Microassembly Technologies for MEMS", University of California at Berkley and University of Washington.

Cohn et al., "Self-Assembling Electrical Networks: An Application of Micromachining Technology", May 1991.

Comtois et al. "Applications for surface-micromachined polysilicon thermal actuators and arrays," Sensors and Actuators A58, 1997, pp. 19-25.

Comtois et al. "Electrothermal actuators fabricated in four-level planarized surface micromachined polycrystalline silicon," Sensors and Actuators A70, 1998, pp. 23-31.

Comtois et al., "Thermal Microactuators for surface-micromachining processes," SPIE vol. 2642, 1995, pp. 10-21.

Dechev et al., "Microassembly of 3-D Microstructure Using a Compliant, Passive Microgripper," Journal of Macroelectromechanical Systems, vol. 13, No. 2, Apr. 2004, pp. 176-189.

Ellis, et al., "High aspect ratio silicon micromechanical connectors", High Aspect Ratio Micro-Structure Technology Workshop, Monterey, California, Jun. 15-17, 2003.

Fearing, "Survey of Sticking Effects for Micro Parts Handling", IEEE, Apr. 1995.

Gomm et al., "In-Plane Linear Displacement Bistable Microrelay", 2002 IOP Publishing Ltd., UK, pp. 257-264.

Handbook of Industrial Robotics, Shimon, Y. Nof, Editor, Chapter 26 and Section 4.1.4., pp. 478-479.

Handbook of Industrial Robotics, Shimon Y. Nof, Editor, Second Edition, 1999, Chapter 5, pp. 43-78.

Hitakawa, "Advanced Parts Orientation System Has Wide Application", Aug. 1988.

IBM Technical Disclosure Bulletin, "Chip-to-Chip Cable Connection," IBM Corp., vol. 27, No. 11, Apr. 1985, pp. 6761-6763.

International Preliminary Examination Report in PCT/US01/015011 dated Sep. 13, 2002.

International Preliminary Examination Report in PCT/US01/15059 dated Aug. 2. 2002.

International Preliminary Examination Report in PCT/US01/24173 dated Jan. 17, 2003.

International Search Report in PCT/US/015011 dated Dec. 3, 2001.

International Search Report in PCT/US01/15059 dated Dec. 12, 2001.

Jensen et al., "Design Optimization of a Fully-Compliant Bistable Micro-Mechanism", Proceedings of 2001 ASME International Mech. Eng. Congress and Expo., New York, Nov. 2001, pp. 1-7.

Keller et al., "Hexsil Tweezers for Teleoperated Microassembly", IEEE Micro Electro Mechanical Systems Workshop, 1997, pp. 72-77.

Keller, Microfabricated High Aspect Ratio Silicon Flexures, 1998.

Kruglick et al., "Bistable MEMS Relays and Contact Characterization", University of California Berkeley Sensors and Actuators Center, pp. 1-5.

Maekoba et al., "Self-Aligned Vertical Mirror and V-Grooves Applied to an Optical-Switch: Modeling and Optimization of Bistable Operation by Electromagnetic Actuation", Sensors and Actuators A 87, 2001, pp. 172.178.

Mohr, "LIGA-A Technology for Fabricating Microstructures and Microsystems," Sensors and Materials, vol. 10, No. 6, 1998, pp. 363-373.

Muray et al., "Advances in Arrayed Microcolumn Lithography", Journal of Vacuum Science and Technology. B, Microelectronics and Nanometer Structures Processing, Measurement and Phenomena: An Official Publication of the American Vacuum Society, vol. 18 (6), Nov./Dec. 2000, pp. 3099-3104. (IRN10495228).

Prasad et al., "Design, Fabrication, and Characterization of Single Crystal Silicon Latching Snap Fasteners for Micro Assembly", Proc. ASME Int.Mech.Eng. Congress and Expo (IMECE'95), San Francisco, CA, Nov. 1995.

Qiu et al., "A Centrally-Clamped Parallel-Beam Bistable MEMS Mechanism", IEEE 2001, pp. 353-356.

Schreiber et al., "Surface Micromachined Electrothermal V-Beam Micromotors", Proc of 2001 ASME International Mechanical Engineering Congress and Exp., Nov. 11, 2001.

Search Report in PCT/US01/24173 dated May 17, 2002.

Szilagyi et al., "Synthesis of Electrostatic Focusing and Deflection Systems," JVST B, 15(6), Nov./Dec. 1997, p. 1971.

Taher et al., "On a Tunable Bistable MEMS- Theory and Experiment", Jorunal of Microelectromechanical Systems, vol. 9, No. 2, Jun. 2000, pp. 157-170.

Tsui et al., "Micromachined end-effector and techniques for directed MEMS assembly," Journal of Micromechanics and Microengineering, Institute of Physics Publishing, United Kingdom, 2004, pp. 1-8.

Yeh et al., "Fluidic Self-Assembly of Microstructures and its Application to the Integration of GaAs on Si", IEEE, Jan. 1994, pp. 279-284.

Yeh et al., "Single Mark, Large Force, and Large Displacement Electrostatic Linear Inchwork Motors," Berkley Sensor and Actuator Center, Department of Electrical Engineering and Computer Science, University of California, Berkley.

Yeh et al., "Surface-Micromachined Components for Articulated Microrobots" Journal of Microelectromechanical Systems, vol. 5, No. 1, Mar. 1996.

* cited by examiner

METHOD OF MANUFACTURING A
MICROCOMPONENT ASSEMBLY

This invention was made with the United States Government support under 70NANB1H3021 awarded by the National Institute of Standards and Technology (NIST). The United States Government has certain rights in the invention.

BACKGROUND

The present invention relates generally to mechanisms for coupling micro-components, and more specifically to microcomponent interconnection utilizing post-assembly activation.

Extraordinary advances are being made in micromechanical devices and microelectronic devices, including microelectro-mechanical devices (MEMs), which comprise integrated micromechanical and microelectronic devices. The terms "microcomponent," "microdevice" and "microassembly" are used herein generically to encompass microelectronic components, micromechanical components, MEMs components and assemblies thereof. Generally, microcomponent devices have feature dimensions that are less than about 1000 microns.

Many methods and structures exist for coupling MEMs and other microcomponents together to form a microassembly. One such method, often referred to as "pick-and-place" assembly, is serial microassembly, wherein microcomponents are assembled one at a time in a serial fashion. For example, if a device is formed by coupling two microcomponents together, a gripper or other placing mechanism is used to pick up one of the two microcomponents and place it on a desired location of the other microcomponent. These pick-and-place processes, although seemingly quite simple, can present obstacles affecting assembly time, throughput and reliability, especially when electrically interconnecting microcomponents during microassembly.

For example, it is commonly accepted that about 1 mN of force is required to achieve an electrical contact of sufficiently low resistance between two gold conductors. However, many existing microassembly procedures, including some pick-and-place procedures, operate with application forces much lower than 1 mN. Thus, many existing microassembly procedures do not provide adequate electrical interconnection of microcomponents, thereby reducing the fabrication yield and assembly reliability.

To overcome this disadvantage, microcomponents may be temporarily positioned for coupling, such that electrical contacts to be coupled are in contact with one another, and electrical current may be provided to the contacts. Consequently, localized heating may occur and the contacts may diffuse with one another. As a result, an electrical interconnection of sufficiently low resistance may be achieved between the coupled microcomponents without requiring the 1 mN of force typically required for microassembly.

However, many microcomponents are not designed to withstand the electrical current required to achieve the localized heating necessary to adequately interconnect the microcomponents. Moreover, such a method is labor extensive and consumes part of the useful life of the microcomponents and assembly.

Accordingly, what is needed in the art is a microcomponent assembly and interconnection method that addresses the above-discussed issues of the prior art.

SUMMARY

The present disclosure relates to a new process and structure for microcomponent interconnection utilizing a post-assembly activated junction compound. In one embodiment, first and second microcomponents having respective first and second contact areas are provided. A junction compound is formed on one of the first and/or second contact areas, and the first and second contact areas are positioned adjacent each other on opposing sides of the junction compound. The junction compound is then activated to couple the first and second microcomponents.

In another embodiment, a substrate having a substrate contact area and first and second microcomponents each having a microcomponent contact area are provided. A junction compound is formed on the substrate contact area and/or the first and second microcomponent contact areas, and the first and second contact areas are positioned adjacent the substrate contact area. The junction compound is then activated to couple the first and second microcomponents to the substrate.

The present disclosure also provides a microcomponent assembly of first and second microcomponents. The first microcomponent has a first contact area and a connecting member, and the second microcomponent has a second contact area and an opening configured to engage the connecting member. A junction compound is located between the first and second contact areas, thereby coupling the first and second microcomponents.

DETAILED DESCRIPTION

Figure 1:
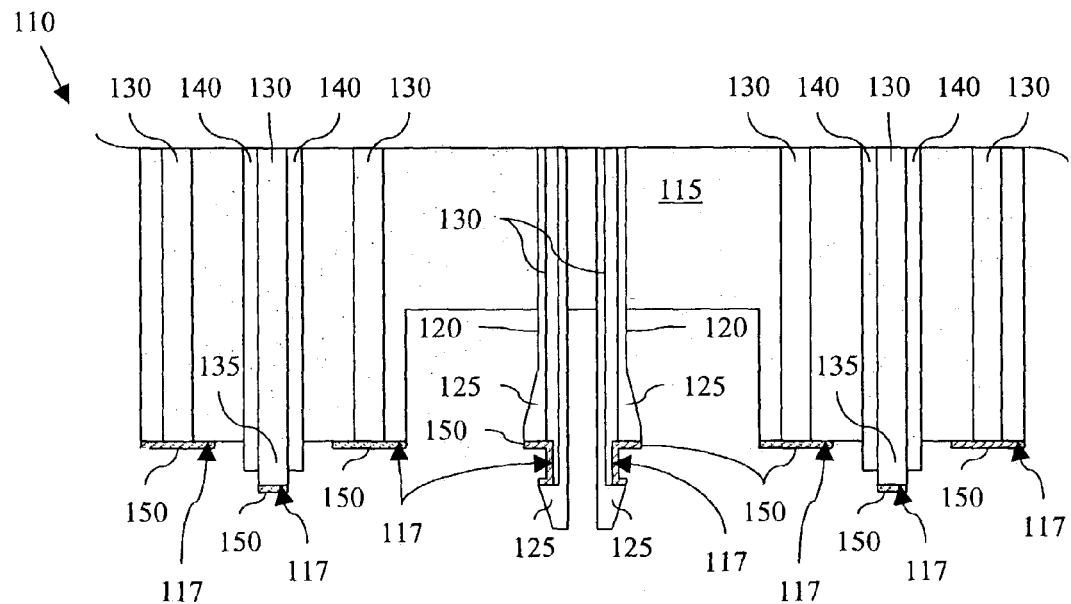
FIG. 1 illustrates an elevation view of one embodiment of a first microcomponent prior to assembly according to aspects of the present disclosure.

Referring initially to FIG. 1, illustrated is an elevation view of one embodiment of a first microcomponent 110 to be assembled according to aspects of the present disclosure. In one embodiment, the microcomponent 110 may have feature dimensions that are less than about 50 microns. In a more specific embodiment, the feature dimensions may be less than about 25 microns. Moreover, the first microcomponent 110 may be a nanocomponent, such as those having feature dimensions less than about 1000 nm. The first microcomponent 110 includes a substrate 115 and at least one connecting member 120 for coupling the first microcomponent 110 to a mating substrate or one or more mating microcomponents. Exemplary mating microcomponents are further discussed in relation to subsequent figures. The connecting members 120 may be formed integral to the first microcomponent 110, or may be discrete features that are mechanically and/or electrically coupled to the first microcomponent 110. The connecting members 120 may include barbed ends 125 configured to engage mating surfaces of one or more mating components.

The first microcomponent 110 may also include first conductive members 130, which may be conductive traces or interconnects comprising gold, aluminum, copper or other materials, as known in the art. The first microcomponent 110 may also include silicon layers 140 supporting one or more of the first conductive members 130 within or over the substrate 115. However, the first microcomponent 110 may also or alternatively include other insulation features electrically isolating the conductive members 130 from the substrate 115, such as but not limited to trench isolation features. In one embodiment, as shown in FIG. 1, the first conductive members 130 may overhang the substrate 115 and/or the silicon layers 140, thereby forming first electrodes 135.

The first microcomponent 110 also includes first contact areas 117 on which first junction compound layers 150 are formed. In one embodiment, one or more of the first junction compound layers 150 are electrically isolated from the first conductive members 130, such as by forming the first junction compound layers 150 a sufficient distance away from the first conductive members 130. However, the first junction compound layers 150 may also be formed directly on or adjacent to one or more of the conductive members 130, such as on the connecting members 120 and/or the electrodes 135. Generally, the first contact areas 117 on which the first junction compound layers 150 are formed may include any surface of the first microcomponent 110 that may be contacted with another microcomponent or substrate. For example, the first junction compound may also be formed on contact areas 117 located on surfaces of the connecting members 120, such as those of the barbed ends 125, as shown in FIG. 1.

The first junction compound layers 150 may include indium, solder (e.g., a tin-based solder), alloys thereof or other conductive materials. The first junction compound layers 150 may be formed on the contact areas 117 by blanket or selective deposition, chemical vapor-deposition (CVD), metal-organic CVD (MOCVD), physical vapor deposition (PVD), atomic layer deposition (ALD), spin-on coating, electroplating, sputtering, ionized metal plasma deposition (IMP) or other conventional or future-developed thin-film deposition processes. An aperture mask, reticle or other patterning device may be employed to form the first junction compound layers 150 on the contact areas 117, such as to prevent overspray of the first junction compound layers 150 outside of the contact areas 117. The first junction compound layers 150 may have a thickness ranging between about 100 nm and about 1000 nm.

Figure 2:
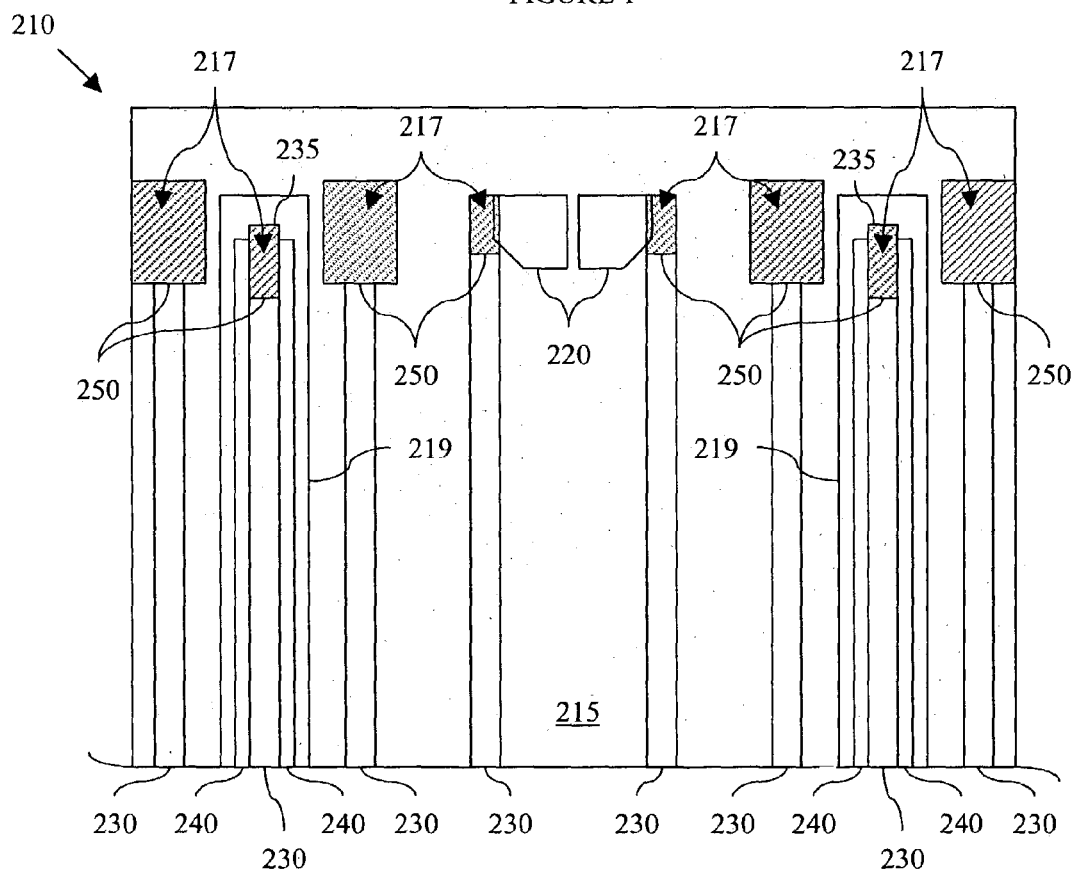
FIG. 2 illustrates a plan view of one embodiment of a second microcomponent prior to assembly according to aspects of the present disclosure.

Referring to FIG. 2, illustrated is a plan view of one embodiment of a second microcomponent 210 to be assembled according to aspects of the present disclosure. As with the first microcomponent 110, the second microcomponent 210 may have feature dimensions that are less than about 50 microns or, in a more specific embodiment, less than about 25 microns. The second microcomponent 210 may also be a nanocomponent. The second microcomponent 210 includes a substrate 215 having apertures 220 configured to receive the connecting members 120 of the first microcomponent 110, such as by engaging the barbed ends 125 of the connecting members 120.

As shown in FIG. 2, the second microcomponent 210 may also include second conductive members 230, which may be conductive traces or interconnects comprising gold, aluminum, copper or other materials, as known in the art. The second microcomponent 210 may also include silicon layers 240 supporting one or more of the second conductive members 230 within or over the substrate 215. As with the first microcomponent 110, the second microcomponent 210 may include other isolation features, in addition to or in the alternative, that isolate the conductive members 230 from the substrate 215.

In one embodiment, as shown in FIG. 2, the second conductive members 230 may overhang the silicon layers 240 and/or the substrate 215, thereby forming second electrodes 235. The second conductive members 230 may be capable of receiving electrical signals when contacted with the first conductive members 130, as described below. Moreover, silicon layers 240 and/or the second conductive members 230 may each be formed in a recess or opening in the substrate 215, such that they may flex or bend relative to the substrate 215. For example, in the embodiment illustrated in FIG. 2, the silicon layers 240 and the second conductive members 230 are formed in openings 219 in the substrate 215. The openings 219 may extend through the substrate 215, thereby allowing the silicon layers 240 and second conductive members 230 to flex beyond the profile of the substrate 215 upon the application of an assembly force, as described below.

The second microcomponent 210 also includes second contact areas 217 on which second junction compound layers 250 are formed. As with the first junction compound layers 150, the second junction compound layers 250 may be electrically isolated from or electrically coupled to the second conductive members 230. Generally, the second junction compound layers 250 may be located on any contact area 217 which may contact another microcomponent or substrate including, in one embodiment, the inside surfaces of the openings 220 and on the electrodes 235.

The second junction compound layers 250 may include indium, solder (e.g., a tin-based solder), alloys thereof or other conductive materials. The second junction compound layers 250 may be formed on the second contact areas 217 by blanket or selective deposition, chemical vapor-deposition (CVD), metal-organic CVD (MOCVD), physical vapor deposition (PVD), atomic layer deposition (ALD), spin-on coating, electroplating, sputtering, ionized metal plasma deposition (IMP) or other conventional or future-developed thin-film deposition processes. A mask, reticle or other patterning device may be employed to form the second junction compound layers 250 on the second contact areas 217, such as to prevent overspray of the second junction compound layers 250 outside of the second contact areas 217. Moreover, the second junction compound layers 250 may be similar in composition and fabrication to the first junction compound layers 150 formed on the first microcomponent 110.

Figure 3:
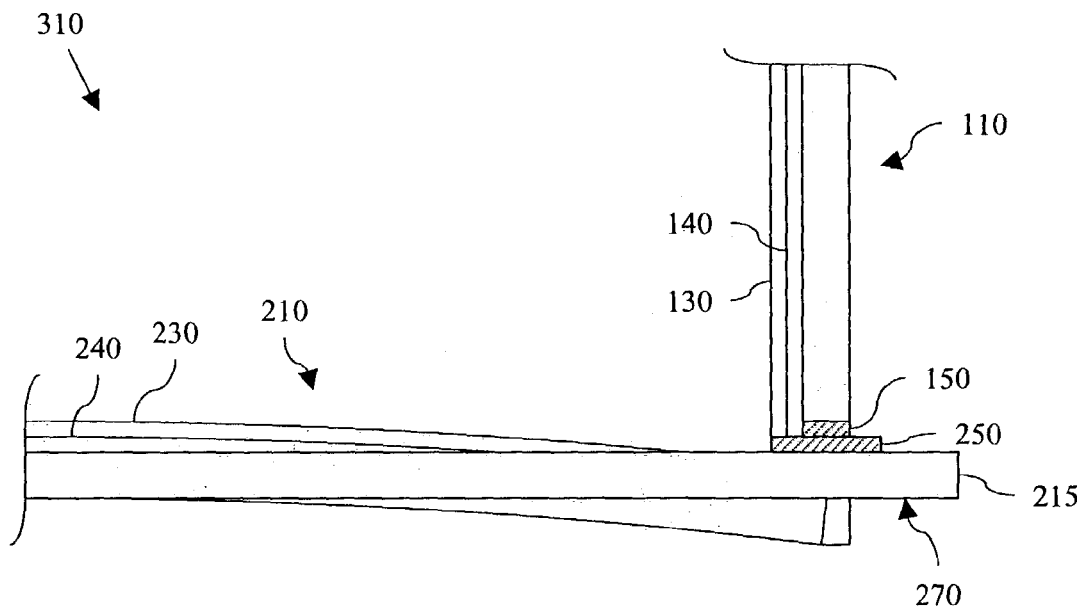
FIG. 3 illustrates a plan view of one embodiment of a microcomponent assembly in an intermediate stage of assembly according to aspects of the present disclosure.

Referring to FIG. 3, illustrated is an elevation view of the first and second microcomponents 110, 210 in an intermediate stage of assembly according to aspects of the present disclosure. In the illustrated embodiment, the first and second microcomponents 110, 210 are positioned relative to each other and mated to preliminarily form a microassembly 310. That is, the first microcomponent 110 is coupled to the second microcomponent 210 by inserting the barbed ends 125 of the connecting members 120 into the apertures 220 in the second microcomponent 210. As such, a surface 270 of the second microcomponent 210 may be a retaining surface configured to engage the connecting members 120. Those skilled in the art will recognize that the retaining surface 270 may be located elsewhere on the second microcomponent 210, including within the openings 220, such as in a tongue-and-groove arrangement. It should be understood that the connecting members 120 may be configured to form a permanent coupling with the apertures 220 in the substrate 215 of the second microcomponent 210, or the connecting members 120 may be configured to form a temporary or removable coupling with the second microcomponent 210 (although such embodiments may require deactivation of the junction compound layers 150, 250, the activation of which being described below).

In the embodiment shown in FIG. 3, the mating of the connecting members 120 of the first microcomponent 110 with the apertures 220 in the substrate 215 of the second microcomponent 210 causes the first and second conductive members 130, 230 to align and contact one another to form an electrical coupling. Accordingly, electrical signals may be communicated between the first and second microcomponents 110, 210 via the joined first and second conductive members 130, 230.

As discussed above, the second conductive members 230 (and possibly the corresponding silicon layers 240) may be flexible, such that they bend away from the first microcomponent 110 when the first and second microcomponents 110, 210 are coupled. More specifically, as the connecting members 120 engage the apertures 220 in the substrate 215 of the second microcomponent 210, the first electrodes 135 engage the second electrodes 235, thereby exerting a force on the second electrodes 235 and causing the second electrodes 235 to flex away from a neutral position. Such an implementation may aid in maintaining a continuous electrical coupling between the first and second electrodes 135, 235. That is, once the second electrodes 235 are flexed away from the first microcomponent 110, they maintain a force against the first electrodes 135 by attempting to return to their neutral position. Consequently, an uninterrupted electrical connection may be more effectively maintained.

Figure 4:
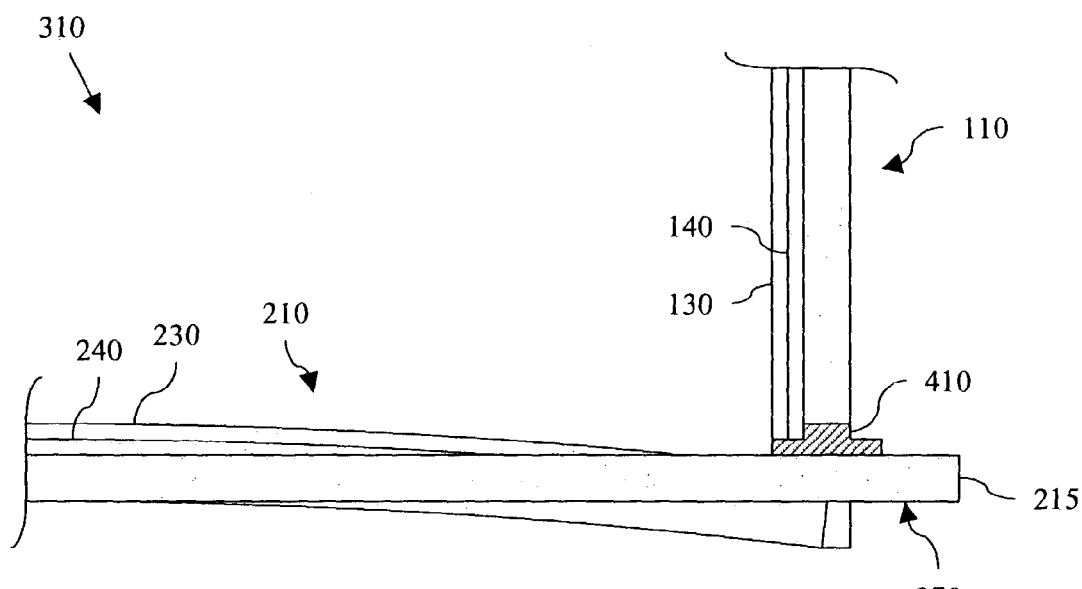
FIG. 4 illustrates a plan view of one embodiment of a substantially completed microcomponent assembly according to aspects of the present disclosure.

As the first and second microcomponents 110, 210 are mated, the engagement of the connecting members 120 with the apertures 220 in the substrate 215 of the second microcomponent 210 also brings the first junction compound layers 150 formed on the first contact areas 117 of the first microcomponent 110 into contact with the second junction compound layers 250 formed on the second contact areas 217 of the second microcomponent 210, as shown in FIG. 3. In order to provide a more robust coupling of the first and second microcomponents 110, 210, the junction compound layers 150, 250 may be activated, thereby adhering the two junction compound layers 150, 250 into a single coupling element. The activation of the junction compound layers 150, 250 may cause them to diffuse into each other to form a mechanical and/or chemical bond. For example, FIG. 4 illustrates an elevation view of the microassembly 310 shown in FIG. 3 after the junction compound layers 150, 250 have been activated, thereby forming activated junction compound layers 410.

The first and second junction compound layers 150, 250 may be activated by myriad processes. In one embodiment, the junction compound layers 150, 250 may be activated by a heating process. For example, the microassembly 310 may be placed proximate a heat lamp, hot-plate or other heater or in an oven or other temperature-controlled process chamber, such that the junction compound layers 150, 250 may be at least partially liquefied. Thereafter, the microassembly 310 may be allowed to cool or may be quenched, such that the junction compound layers 150, 250 may solidify to form the junction compound layers 410. In another embodiment, the microassembly 310 may undergo a solder reflow process, possibly one that may be performed to electrically couple other components in the microassembly 310. Those skilled in the art are familiar with solder reflow processes, and will understand that many conventional or future-developed reflow processes may be employed to mechanically, electrically and/or chemically couple the first and second junction compound layers 150, 250. In another embodiment, localized heating such as that achievable with a laser device may be employed to activate the first and second junction compound layers 150, 250. A heated gripping or placing mechanism, or a gripping mechanism that includes a heater element, may also be employed during activation of the first and/or second junction compound layers 150, 250, whereby activation may be at least partially performed by thermal energy transferred from the gripping mechanism to the junction compound layer(s). The first and second junction compound layers 150, 250 may also be activated by exposure to UV radiation or a chemical composition/catalyst.

The activation of the first junction compound layers 150 may also form a more robust coupling with the first contact areas 117. Similarly, the activation process may provide more structural integrity between the second compound layers 250 and the second contact areas 217. In view of this advantage, those skilled in the art will understand that some embodiments of the microassembly 310 may not incorporate the first or second junction compound layers 150, 250. For example, the first junction compound layers 150 may be formed on the first microcomponent 110, but the second junction compound layers 250 may be omitted from the assembly process. In such an embodiment, the activation of the first junction compound layers 150 may strengthen the bond of the first junction compound layers 150 to the first microcomponent 110 and may also form a bond with the second contact areas 217 of the second microcomponent 210. Thus, employing both the first and second junction compound layers 150, 250 may not be necessary in all embodiments. Such an arrangement may decrease the time, costs and complexity of assembling the microassembly 310.

Moreover, those skilled in the art will recognize that the first and second microcomponents 110, 210 may be coupled by the first and/or second junction compound layers 150, 250 in the absence of the mechanical coupling of the connecting members 120 and the apertures 220 in the substrate 215 of the second microcomponent 210. In such an embodiment, the connecting members 120 may be modified for use as alignment aids, or may be omitted altogether. Again, such an arrangement may decrease the time, costs and complexity of assembling the microassembly (e.g., less complex pick-and-place operations), as well as the manufacture of the microcomponents 110, 210 themselves. In any case, the implementation of the junction compound layers 410 according to aspects of the present disclosure may provide a stronger ohmic contact between the first and second microcomponents 110, 210, thereby reducing the resistance of the electrical coupling therebetween without requiring the use of excessive force to pick-and-place the microcomponents 110, 210 during assembly.

Although the first and second microcomponents 110, 220 shown in FIGS. 1–3 each include eight electrical conductors 130, 230, respectively, it should be understood that any number of such electrical conductors may be included in or on the microcomponents 110, 220 in various implementations, and that such implementations are intended to be within the scope of the present disclosure.

Figure 5:
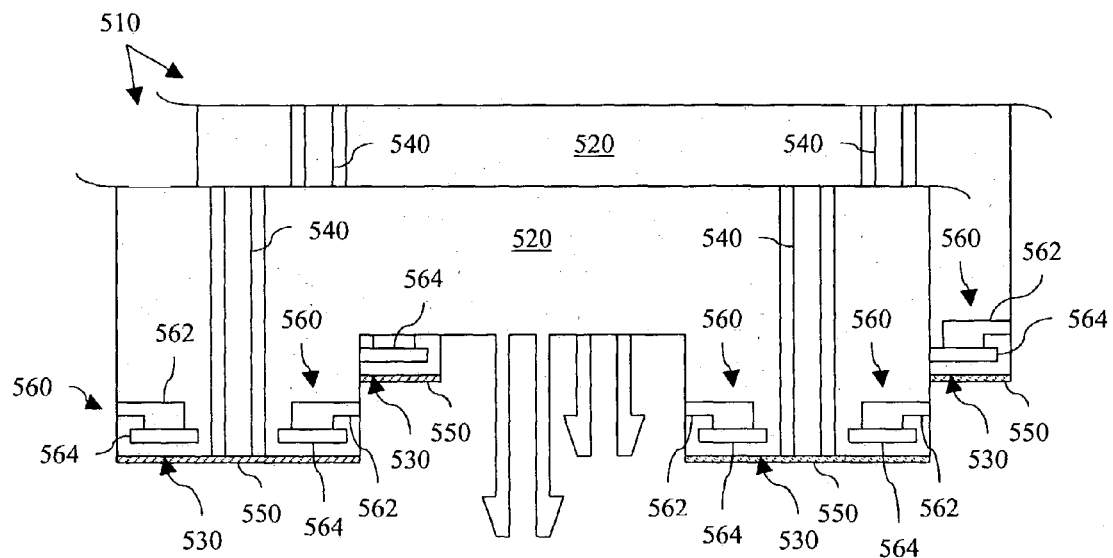
FIG. 5 illustrates an elevation view of another embodiment of microcomponents prior to assembly according to aspects of the present disclosure.

Referring to FIG. 5, illustrated is an elevation view of another embodiment of first and second microcomponents 510 prior to assembly according to aspects of the present disclosure. The microcomponents 510 may be or include nanocomponents, and may be substantially similar to the first microcomponent 110 shown in FIG. 1. For example, the microcomponents 510 each include a substrate 520, first contact areas 530 and first conductive members 540, and may each include first junction compound layers 550 formed on the first contact areas 530. The substrates 520, first contact areas 530, first conductive members 540 and first junction compound layers 550 may be similar to the substrate 115, first contact areas 117, first conductive members 130 and first junction compound layers 150 shown in FIG. 1. For example, in one embodiment, as shown in FIG. 5, one or more of the first junction compound layers 550 may contact one or more of the first conductive members 540, or be located very close to one of the first conductive members 540 such that activation of the first junction compound layers 550 may result in electrical contact between one or more of the first junction compound layers 550 and one or more of the first conductive members 540.

The microcomponents 510 may also include first heating elements 560 each located proximate one or more of the first junction compound layers 550. The first heating elements 560 may include circuitry 562 for receiving power signals from a power device in or on the first microcomponents 510 or other components (not shown). The first heating elements 560 may also include a resistor 564 or other electrical device configured to dissipate heat in response to power received via the circuitry 562. In one embodiment, the resistor 564 may include one or more spans of aluminum, copper, doped silicon or other materials known in the art to dissipate heat under electrical power. The resistor 564 may have a conductivity of about 0.01 Ω-cm.

Figure 6:
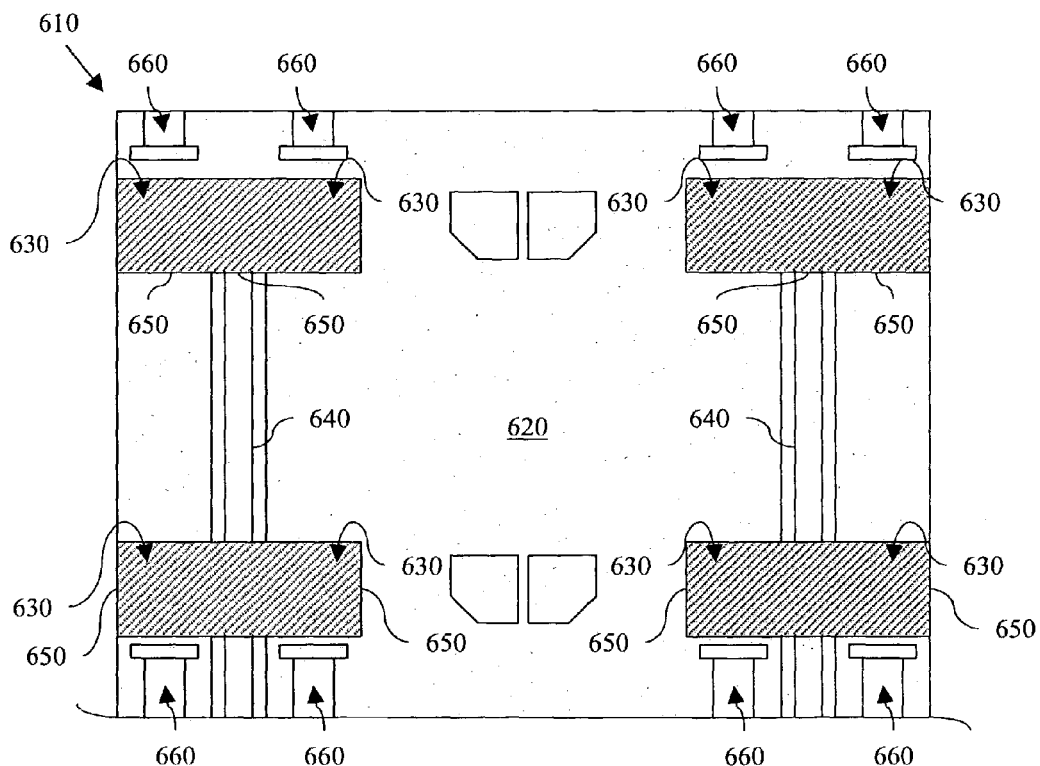
FIG. 6 illustrates a plan view of one embodiment of a microcomponent substrate element prior to assembly according to aspects of the present disclosure.

Referring to FIG. 6, illustrated is a plan view of an embodiment of a substrate element 610 prior to assembly according to aspects of the present disclosure. The substrate element 610 includes a support frame 620 (which may itself be a substrate), second contact areas 630 and second conductive members 640. The substrate element 610 may also include second junction compound layers 650 formed on the second contact areas 630. The second contact areas 630, second conductive members 640 and second junction compound layers 650 may be similar to the second contact areas 217, second conductive members 230 and second junction compound layers 250 shown in FIG. 2. In one embodiment, such as that illustrated in FIG. 6, one or more of the second junction compound layers 650 may be in electrical contact with one or more of the second conductive members 640, or be located very close to one of the second conductive members 640 such that activation of the second junction compound layers 650 results in electrical contact between one or more of the second junction compound layers 650 and one or more of the second conductive members 640. The substrate element 610 may also include one or more second heating elements 660 proximate one or more of the second junction compound layers 650. The second heating elements 660 may be similar in composition and manufacture to the first heating elements 560.

Figure 7:
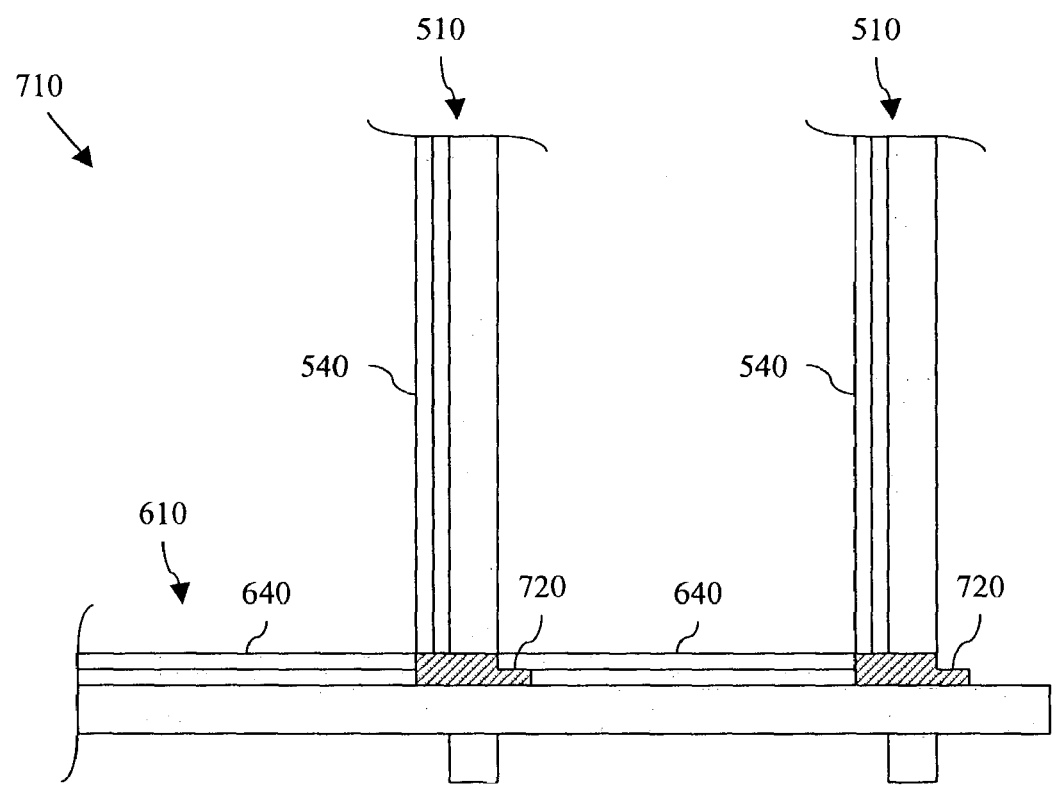
FIG. 7 illustrates an elevation view of another embodiment of a microcomponent assembly constructed according to aspects of the present disclosure.

Referring to FIG. 7, illustrated is an elevation of a microassembly 710 formed by positioning and mating the first and second microcomponents 510 to the substrate element 610 and activation of the first and second junction compound layers 550, 650 to form junction compound layers 720. Activation of the first and second junction compound layers 550, 650, which may be similar to the activation of the first and second compound layers 150, 250 discussed above, provides additional mechanical coupling between the microcomponents 510 and the substrate element 610. Activation of the first and second junction compound layers 550, 650 may also electrically couple the first and second conductive members 540, 640, thereby providing a strong ohmic contact having sufficiently low resistance.

In one embodiment, the activation of the first and second junction compound layers 550, 650 may be performed by operating one or more of the heating elements 560, 660. In such an embodiment, the heat dissipated by the heating elements 560, 660 may at least partially liquefy the first and second junction compound layers 550, 650. After operating the heating elements 560, 660, the resulting junction compound layers 720 may be allowed to cool or be quenched, thereby coupling the microcomponents 510 to the substrate element 610. Those skilled in the art will recognize that one or more of the first heating elements 560 may be configured to dissipate sufficient heat to activate an immediately proximate first junction compound layer 550 as well as a more distal second junction compound layer 650 (and vice versa). Similarly, one or more of the first heating elements 560 may be configured to dissipate sufficient heat to activate more than the immediately proximate first junction compound layer 550, including more distal ones of the first junction compound layers 550.

Those skilled in the art will also recognize that, as discussed above, it is not necessary that each embodiment include both the first and second junction compound layers 550, 650. That is, in some embodiments, forming only the first or second junction compound layers 550, 650, or a combination thereof, may be sufficient to adequately couple the microcomponents 510 to the substrate element 610.

In one embodiment, the microcomponents 510 may be positioned on and mated to the substrate element 610 prior to the activation of the first and second junction compound layers 550, 650. In another embodiment, each of the microcomponents 510 may be positioned on and mated to the substrate element 610 and the corresponding junction compound layers 550, 650 may be activated prior to the positioning and mating of other microcomponents 510.

The present invention has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

The invention claimed is:

1. A method of manufacturing a microcomponent assembly, comprising:
    providing a first microcomponent having a first contact area and having a first feature dimension less than about 50 microns;
    providing a second microcomponent having a second contact area and having a second feature dimension less than about 50 microns;
    forming a junction compound on at least one of the first and second contact areas;

positioning the first and second contact areas adjacent each other on opposing sides of the junction compound; and activating the junction compound to couple the first and second microcomponents.

2. The method recited in claim 1 wherein the first and second feature dimensions are each less than about 25 microns.

3. The method recited in claim 1 wherein the junction compound comprises indium.

4. The method recited in claim 1 wherein activating the junction compound electrically couples the first and second microcomponents.

5. The method recited in claim 1 wherein the junction compound is formed on both of the first and second contact areas.

6. The method recited in claim 1 wherein the junction compound is formed by sputtering.

7. The method recited in claim 1 wherein the junction compound is formed by a method selected from the group consisting of:
  electroplating;
  chemical vapor deposition (CVD);
  plasma enhanced CVD;
  physical vapor deposition;
  ionized metal plasma deposition; and
  atomic layer deposition.

8. The method recited in claim 1 wherein activating the junction compound comprises heating the junction compound.

9. The method recited in claim 8 wherein the junction compound is heated by heating the first and second microcomponents in a temperature-controlled process chamber.

10. The method recited in claim 8 wherein the junction compound is heated by exposing the junction compound to a laser.

11. The method recited in claim 8 wherein at least one of the first and second microcomponents comprises a heater element proximate the junction compound and the junction compound is heated by operating the heater element.

12. The method recited in claim 8 wherein the junction compound is heated by thermal energy transferred from a gripping mechanism to the junction compound.

13. The method recited in claim 1 wherein at least one of the first and second microcomponents is a nanocomponent.

14. The method recited in claim 1 wherein one of the first and second microcomponents is a substrate.

15. The method recited in claim 1 further comprising:
  providing a substrate having a third contact area;
  forming an additional junction compound on at least one of the third contact area and a fourth contact area of one of the first and second microcomponents;
  positioning the third and fourth contact areas adjacent opposing sides of the additional junction compound; and
  activating the additional junction compound to couple the one of the first and second microcomponents having the fourth contact area to the substrate.

16. The method recited in claim 15 wherein activating the junction compound between the first and second contact areas includes substantially simultaneously activating the additional junction compound between the third and fourth contact areas.

17. The method recited in claim 15 wherein the third and fourth contact areas are positioned before the additional junction compound is activated.

18. The method recited in claim 1 wherein activating the junction compound to couple the first and second microcomponents includes activating the junction compound to mechanically and electrically couple the first and second microcomponents.

19. The method recited in claim 18 wherein activating the junction compound to mechanically and electrically couple the first and second microcomponents includes activating the junction compound via thermal energy.

20. The method recited in claim 18 wherein at least one of the first and second microcomponents comprises a heater element, and wherein activating the junction compound via thermal energy includes operating the heater element.

21. A method of manufacturing a microcomponent assembly, comprising:
  providing a first microcomponent having a first contact area;
  providing a second microcomponent having a second contact area, wherein at least one of the first and second microcomponents has at least one feature dimension that is less than about 50 microns;
  forming a junction compound on at least one of the first and second contact areas; and
  coupling the first and second microcomponents by:
    positioning the first and second contact areas adjacent each other on opposing sides of the junction compound; and
    activating the junction compound.

22. The method recited in claim 21 wherein activating the junction compound occurs before positioning the first and second contact areas adjacent each other on opposing sides of the activated junction compound.

23. The method recited in claim 21 wherein activating the junction compound occurs after positioning the first and second contact areas adjacent each other on opposing sides of the un-activated junction compound.

24. The method recited in claim 21 wherein the junction compound comprises indium.

25. The method recited in claim 21 wherein coupling the first and second microcomponents by the positioning and the activating includes mechanically and electrically coupling the first and second microcomponents.

26. The method recited in claim 21 wherein at least one of the first and second microcomponents comprises a heater element and activating the junction compound comprises heating the junction compound by operating the heater element.

27. The method recited in claim 21 wherein activating the junction compound comprises heating the junction compound by thermal energy transferred from a gripping mechanism to the junction compound.

* * * * *